United States Patent
Daubenspeck et al.

(10) Patent No.: US 7,601,628 B2
(45) Date of Patent: Oct. 13, 2009

(54) WIRE AND SOLDER BOND FORMING METHODS

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 289 days.

(21) Appl. No.: 11/561,437

(22) Filed: Nov. 20, 2006

(65) Prior Publication Data

US 2008/0119036 A1  May 22, 2008

(51) Int. Cl.
*H01L 21/60* (2006.01)
(52) U.S. Cl. ............... 438/617; 438/612; 257/E21.508; 257/E21.509
(58) Field of Classification Search ............... 438/612, 438/617
See application file for complete search history.

(56) References Cited

U.S. PATENT DOCUMENTS

| | | | |
|---|---|---|---|
| 5,844,317 A | 12/1998 | Bertolet et al. | |
| 6,204,074 B1 | 3/2001 | Bertolet et al. | |
| 6,534,863 B2 | 3/2003 | Walker et al. | |
| 6,577,008 B2 | 6/2003 | Lam et al. | |
| 6,762,117 B2 | 7/2004 | Lam et al. | |
| 6,762,122 B2 | 7/2004 | Mis et al. | |
| 2008/0119035 A1* | 5/2008 | Daubenspeck et al. | 438/612 |

FOREIGN PATENT DOCUMENTS

GB  2268108 A  1/1994

\* cited by examiner

*Primary Examiner*—Zandra V. Smith
*Assistant Examiner*—Pamela E Perkins
(74) *Attorney, Agent, or Firm*—Michael LeStrange; Hoffman Warnick LLC (57) ABSTRACT

Methods of forming wire and solder bonds are disclosed. In one embodiment, a method includes providing a structure including a wire bond metal region for the wire bond and a solder bond metal region for the solder bond, both regions covered by a silicon nitride layer over a silicon oxide layer; forming in a material a first opening to the silicon oxide layer over the wire bond metal region and a second opening exposing the solder bond metal region; forming the solder bond to the solder bond metal region while the wire bond metal region is covered; exposing the wire bond metal region including removing the silicon oxide layer to the wire bond metal region; and forming the wire bond to the wire bond metal region. Wire bonds and solder bonds can be made accessible on a single multi-part wafer (MPW) or on a single chip, if necessary, and can be formed substantially simultaneously.

20 Claims, 10 Drawing Sheets

WIRE AND SOLDER BOND FORMING METHODS

BACKGROUND OF THE INVENTION

1. Technical Field

The invention relates generally to semiconductor device packaging, and more particularly, to methods of forming wire and solder bonds.

2. Background Art

Simultaneous use of wire bond and solder bond structures in the semiconductor industry is increasing. In one example, wire and solder bonds are advantageous for use in multi-part wafers (MPWs), which are currently increasing in popularity. Some of these MPWs include chips that require both wire bonds and solder bonds designed into a common reticle, i.e., they are fabricated together. In a solder bond, a solder joint flip chip connection to a substrate is made where the surface tension forces of the molten solder controls the height of the joint and supports the weight of the chip. The solder bond is oftentimes referred to as a controlled collapse chip connection (C4). In a wire bond, a wire is joined to an opening in the chip. Where both types of bonds are used, the fabrication process must be capable of opening both wire bond and solder bond final via structures in parallel.

The ability to create both wire bond and solder bond structures within a single processed part extends beyond use with MPWs. There are certain chip products (or test sites) that also require both solder and wire bond access points within the boundary of the individual chip itself. For example, in the case of parts being built for stacked packages, wherein the chips must make solder bond connections to other chips within the stack, but also a wire bond connection out to the package substrate or laminate. Simultaneous use of wire and solder bonds may also be advantageous for a technology qualification test-site. For example, it may be preferred to have both types of connections for a single common test site in order to enable qualification of front-end-of-line (FEOL) and back-end-of-line (BEOL) structures in both wire and solder bond packaging environments, but without having to design and build two different test-sites.

Generating wire and solder bonds together presents a number of challenges. For example, some of the processes used for each type of bond are detrimental to the other type of bond.

SUMMARY OF THE INVENTION

Methods of forming wire and solder bonds are disclosed. In one embodiment, a method includes providing a structure including a wire bond metal region for the wire bond and a solder bond metal region for the solder bond, both regions covered by a silicon nitride layer over a silicon oxide layer; forming in a material a first opening to the silicon oxide layer over the wire bond metal region and a second opening exposing the solder bond metal region; forming the solder bond to the solder bond metal region while the wire bond metal region is covered; exposing the wire bond metal region including removing the silicon oxide layer to the wire bond metal region; and forming the wire bond to the wire bond metal region. Wire bonds and solder bonds can be made accessible on a single multi-part wafer (MPW) or on a single chip, if necessary, and can be formed substantially simultaneously.

A first aspect of the invention provides a method of forming a wire bond and a solder bond, the method comprising: providing a structure including a wire bond metal region for the wire bond and a solder bond metal region for the solder bond, both regions covered by a silicon nitride layer over a silicon oxide layer; forming in a material a first opening to the silicon oxide layer over the wire bond metal region and a second opening exposing the solder bond metal region; forming the solder bond to the solder bond metal region while the wire bond metal region is covered; exposing the wire bond metal region including removing the silicon oxide layer to the wire bond metal region; and forming the wire bond to the wire bond metal region.

A second aspect of the invention provides a method of forming a wire bond and a solder bond, the method comprising: providing a structure including a wire bond metal region for the wire bond and a solder bond metal region for the solder bond, both regions covered by a silicon nitride layer over a silicon oxide layer; forming in a material a first opening to the silicon oxide layer over the wire bond metal region and a second opening exposing the solder bond metal region by: forming a first photoresist over the silicon nitride layer over the solder bond metal region and the wire bond metal region, forming an intermediate opening over only the solder bond metal region through the first photoresist, removing the silicon nitride layer over only the solder bond metal region using the intermediate opening, removing the first photoresist, depositing an uncured photosensitive polyimide (PSPI) layer as the material, forming the first opening through the PSPI layer over the wire bond metal region and the second opening through the PSPI layer over the solder bond metal region, and curing the PSPI layer; etching to expose the solder bond metal region and remove the silicon nitride layer to the silicon oxide layer over the wire bond metal region; forming the solder bond to the solder bond metal region while the wire bond metal region is covered; exposing the wire bond metal region including removing the silicon oxide layer to the wire bond metal region; and forming the wire bond to the wire bond metal region.

A third aspect of the invention provides a method of forming a wire bond and a solder bond, the method comprising: providing a structure including a wire bond metal region for the wire bond and a solder bond metal region for the solder bond, both regions covered by a silicon nitride layer over a silicon oxide layer; forming in a material a first opening to the silicon oxide layer over the wire bond metal region and a second opening exposing the solder bond metal region by: forming an uncured polyimide layer as the material over the silicon nitride layer over the solder bond metal region and the wire bond metal region, forming the first opening through the uncured polyimide layer to the silicon oxide layer over only the wire bond metal region using a first photoresist that covers the solder bond metal region, removing the first photoresist, forming the second opening through the uncured polyimide layer to only the solder bond metal region using a second photoresist that covers the wire bond metal region, removing the second photoresist, and curing the polyimide layer; forming the solder bond to the solder bond metal region while the wire bond metal region is covered; exposing the wire bond metal region including removing the silicon oxide layer to the wire bond metal region; and forming the wire bond to the wire bond metal region.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
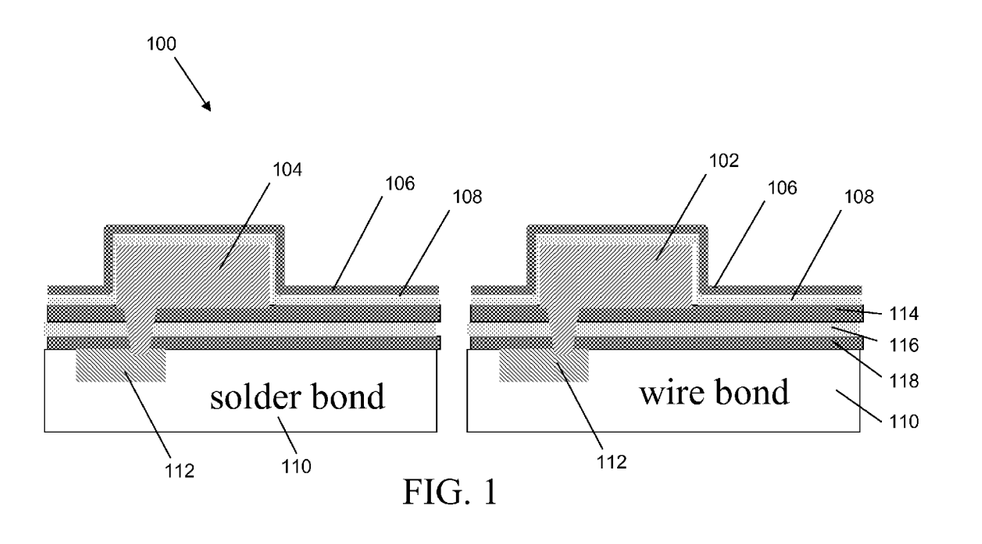
FIG. 1 shows a preliminary structure according to one embodiment of the invention.
Figure 6:
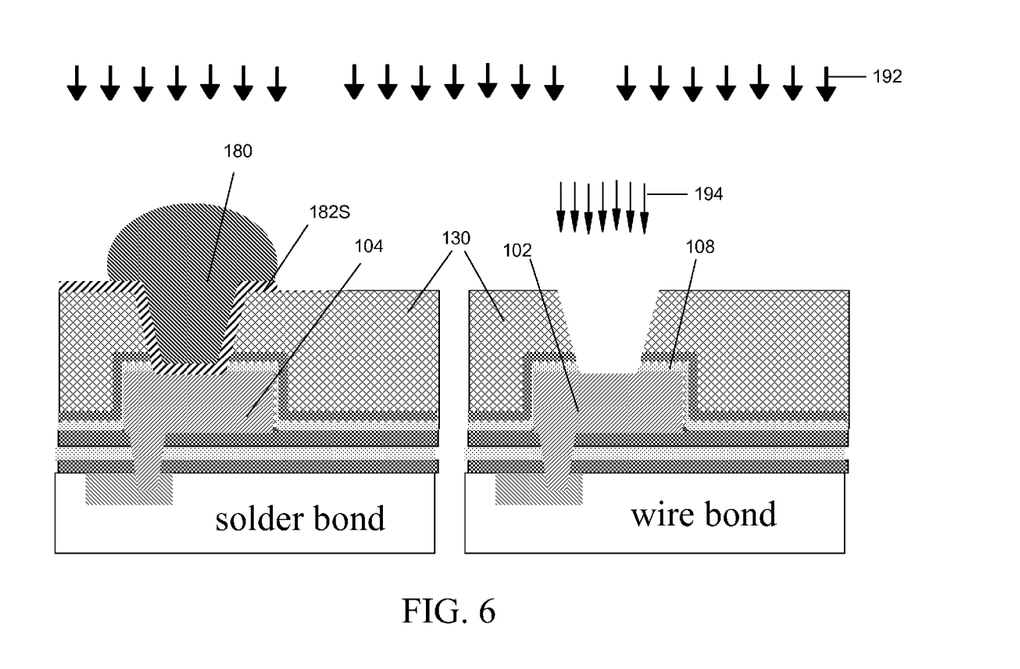
Figure 7:
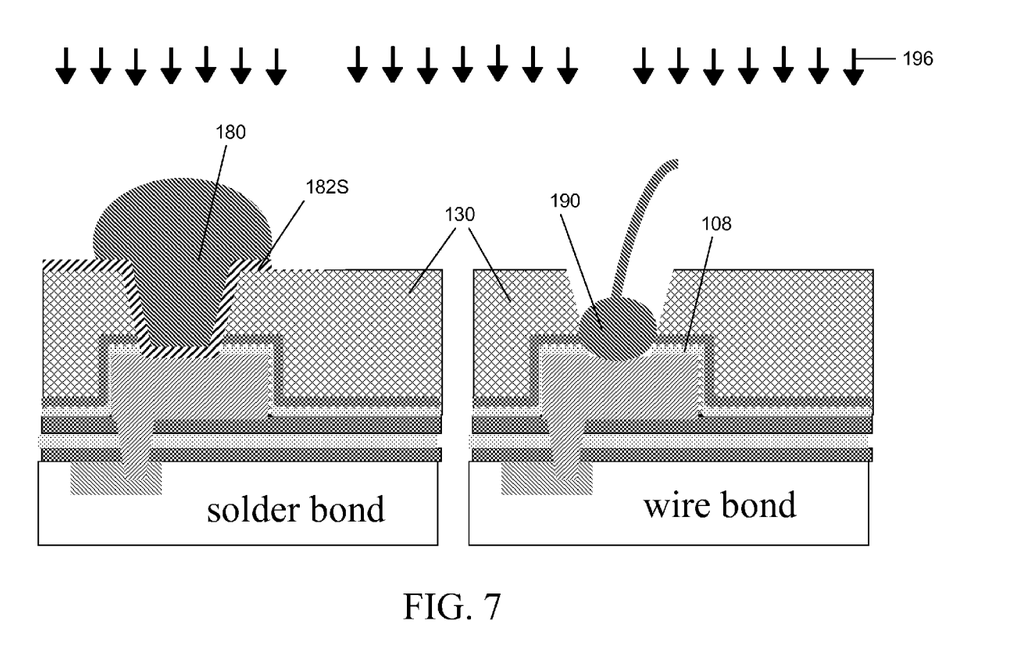

Turning to the drawings, various embodiments of a method of forming wire and solder bonds are shown. FIG. 1 shows a preliminary structure 100 that is provided and includes a wire bond metal region 102 for a wire bond 190 (FIG. 7) and a solder bond metal region 104 for a solder bond 180 (FIGS. 6-7). Although shown separated, regions 102, 104 may be included in a single chip or be provided in a multi-part wafer. Hence, the separation indicated in the figures is meant to illustrate potential distance between regions 102, 104, not necessarily total separation. As illustrated, both regions 102, 104 are covered by a silicon nitride ($Si_3N_4$) layer 106 over a silicon oxide ($SiO_2$) layer 108. Silicon nitride layer 106 may have a thickness of, for example, approximately 0.4 µm, and silicon oxide layer 108 may have a thickness of, for example, approximately 0.45 µm. However, the invention is not limited to those dimensions. Other structure provided may include substrate 110 (e.g., a dielectric) including a wire 112 (e.g., copper or aluminum) and barrier layers 114, 116, 118 (e.g., silicon nitride, silicon oxide and silicon nitride, respectively). Each of metal region 102, 104 may include, for example, aluminum or copper.

Figure 2:
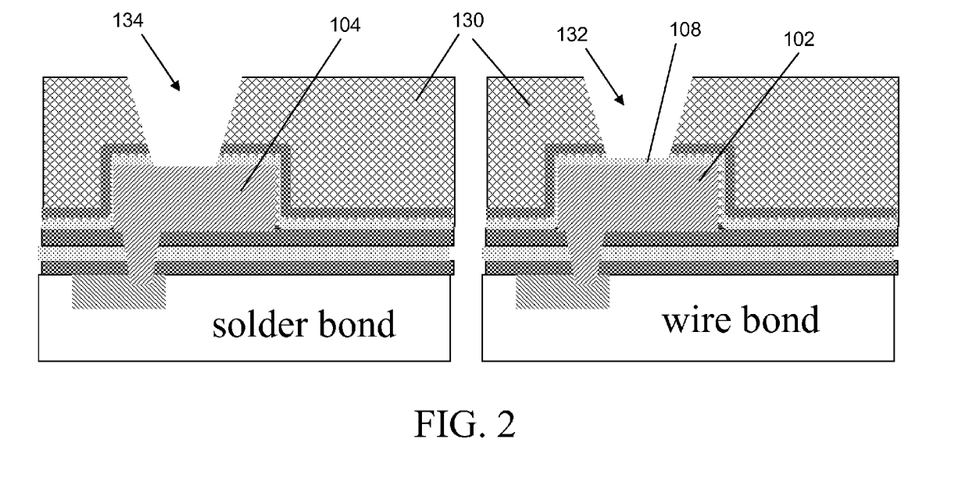
FIG. 2 shows a result of one portion of a method according to one embodiment of the invention.
Figure 3A:
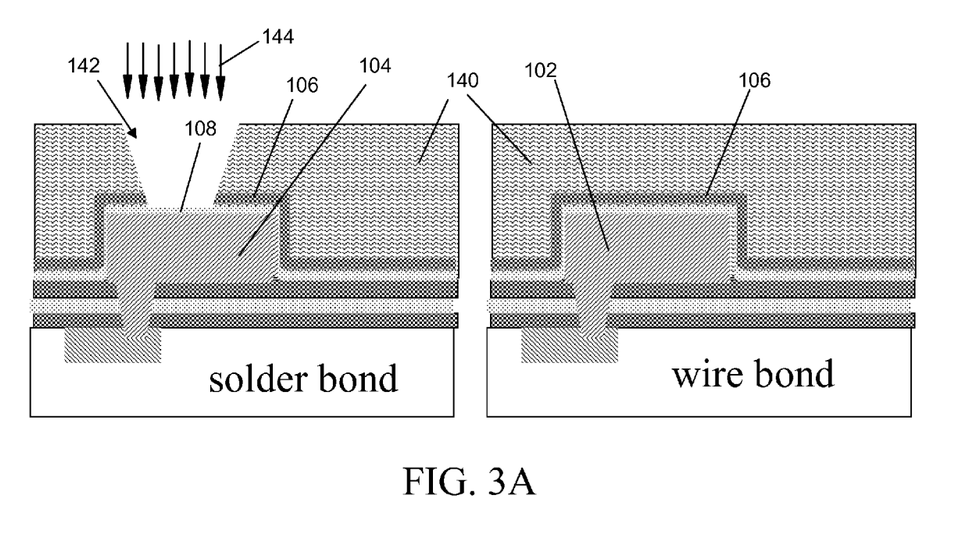
FIGS. 3A-B show one embodiment of forming the structure of FIG. 2.
Figure 3B:
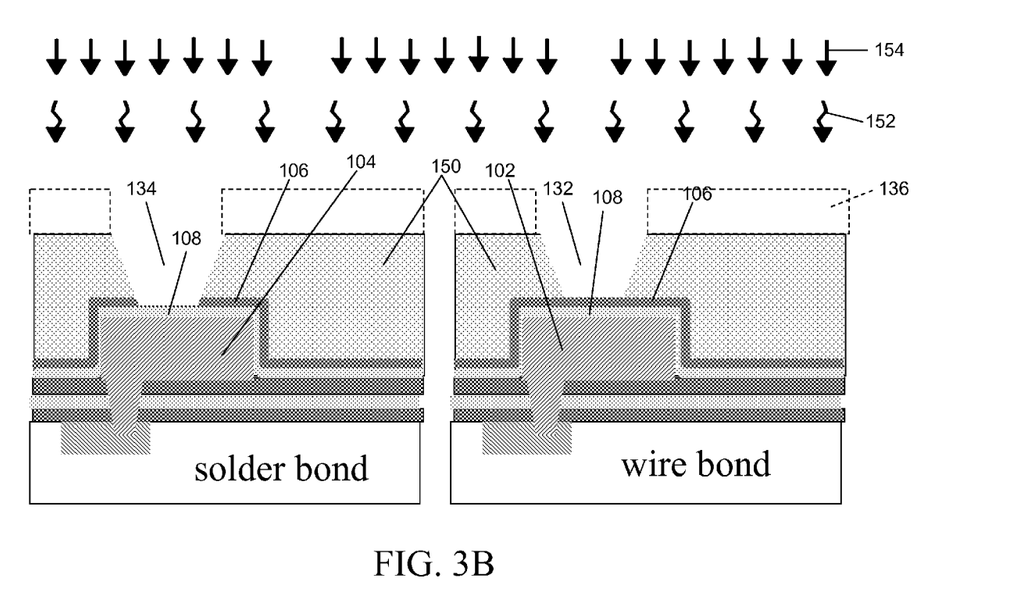

FIG. 2 shows forming, in a material 130, a first opening 132 to silicon oxide layer 108 over wire bond metal region 102 and a second opening 134 exposing solder bond metal region 104. As will be described below, material 130 may take the form of a photoresist or a polyimide. This step may occur in a number of ways, as shown in FIGS. 3A-3B and FIGS. 4A-4C. Referring to FIGS. 3A-3B, in one embodiment, this process may begin, as shown in FIG. 3A, by forming a first photoresist 140 over silicon nitride layer 106 over solder bond metal region 104 and wire bond metal region 102. Photoresists described herein may include any now known or later developed photoresist material (typically a positive resist, for example, JSR M20 or Shipley UV2HS), except where expressly denoted. An intermediate opening 142 may be formed through first photoresist 140 over only solder bond metal region 104 in any now known or later developed manner, e.g., patterning and etching. An etching 144, e.g., a reactive ion etch (RIE), is performed to remove silicon nitride layer 106 (stopping at silicon oxide layer 108) over only solder bond metal region 104 using intermediate opening 142. First photoresist 140 is then removed using any now known or later developed stripping process.

FIG. 3B shows depositing an uncured photosensitive polyimide (PSPI) layer 150. Depositing, as used herein, may include any now known or later developed deposition technique appropriate for the materials being deposited. For example, deposition may include but is not limited to spin application of organic materials like photoresist and polyimide, in addition to inorganic films deposited by chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), sputtering deposition, ion beam deposition, electron beam deposition, laser assisted deposition, spin-on methods, physical vapor deposition (PVD), atomic layer deposition (ALD), depending on the materials deposited. In any event, PSPI layer 150 ultimately acts as material 130 (FIG. 2) in this embodiment. PSPI layer 150 may include, for example, HD4000 series photosensitive polyimide materials from HD Microsystems, etc. First opening 132 and second opening 134 are then begun, e.g., by imaging PSPI layer 150 with a photoresist 136 (shown in phantom) that opens both openings 132, 134. First opening 132 is initially formed through uncured PSPI layer 150 over wire bond metal region 102 and second opening 134 is initially formed through uncured PSPI layer 150 over solder bond metal region 104. Next, as also shown in FIG. 3B, PSPI layer 150 is cured 152, e.g., by a thermal process. A non-selective etching 154 (e.g., RIE) is performed next to expose solder bond metal region 104 and remove silicon nitride layer 106 to silicon oxide layer 108 over wire bond metal region 102, resulting in the structure shown in FIG. 2. That is, etching 154 removes silicon oxide layer 108 over solder bond metal region 104 and simultaneously removes only silicon nitride layer 106 over wire bond metal region 102, thus maintaining a protective layer over wire bond metal region 102.

Figure 4A:
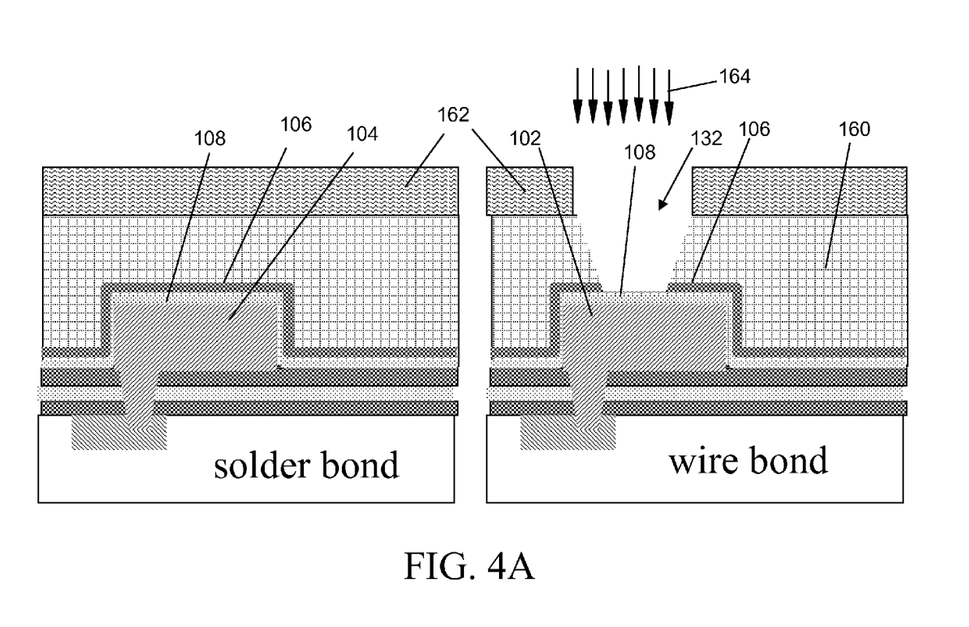
FIGS. 4A-C show another embodiment of forming the structure of FIG. 2.
Figure 4B:
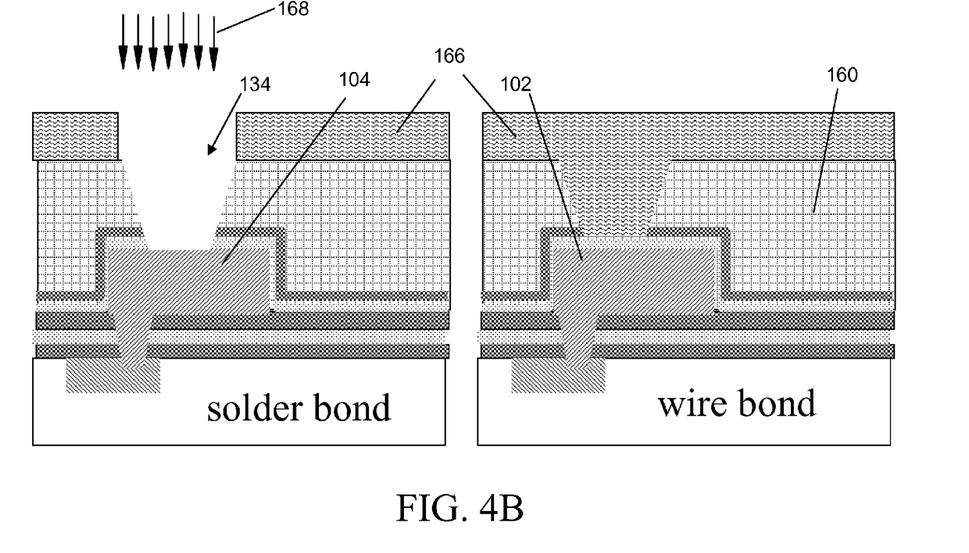
Figure 4C:
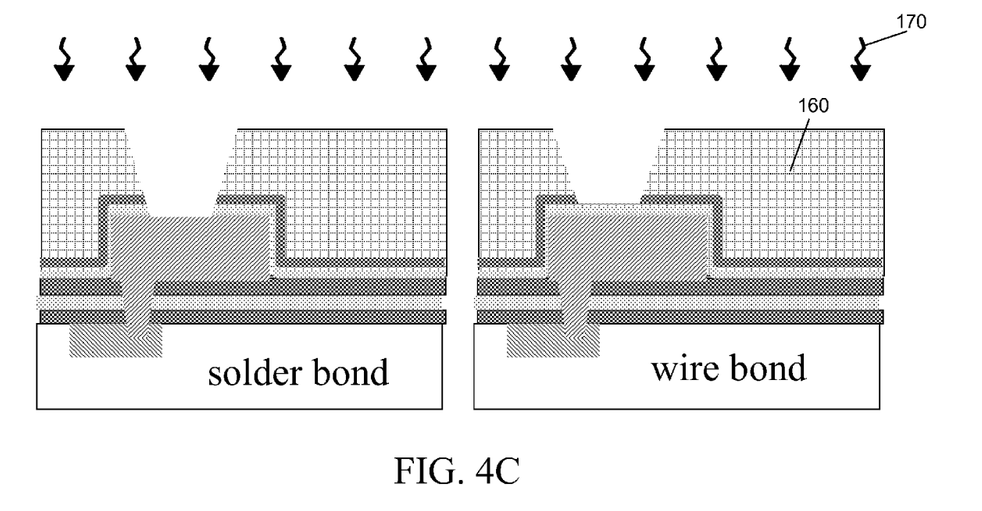

Turning to FIGS. 4A-C, an alternative embodiment is shown for forming, in material 130 (FIG. 2), first opening 132 (FIG. 2) to silicon oxide layer 108 over wire bond metal region 102 and second opening 134 (FIG. 2) exposing solder bond metal region 104. This embodiment also is initiated with structure 100 of FIG. 1. FIG. 4A shows forming an uncured polyimide layer 160 over silicon nitride layer 106 over both solder bond metal region 104 and wire bond metal region 102. Uncured polyimide layer 160 may include, for example, PI5878 formulation from HD Microsystems. In this embodiment, polyimide layer 160 acts as material 130 (FIG. 2), as will be described below, and is non-photosensitive. Next, as also shown in FIG. 4A, first opening 132 is formed through uncured polyimide layer 160 to only wire bond metal region 102 (i.e., solder bond metal region 104 remains covered) using a photoresist 162. First opening 132 is extended to silicon oxide layer 108 over only wire bond metal region 102 using photoresist 162 and etching 164 (e.g. RIE). That is, etching 164 removes silicon nitride layer 106 over wire bond metal region 102, but leaves silicon oxide layer 108. Next, photoresist 162 is removed using any now known or later developed stripping process.

As shown in FIG. 4B, second opening 134 is formed through uncured polyimide layer 160 to solder bond metal region 104 only using another photoresist 166 that covers wire bond metal region 102. That is, photoresist 166 is deposited in any manner over solder bond metal region 104 and wire bond metal region 102, and is patterned and etched over solder bond metal region 104. Etching 168 (e.g., RIE) is then used to form second opening 134 to expose solder bond metal region 104, i.e., remove both silicon nitride layer 106 and silicon oxide layer 108 over solder bond metal region 104. Wire bond metal region 102 remains protected by photoresist 166. As shown in FIG. 4C, photoresist 166 (FIG. 4B) is removed using any now known or later developed stripping process, and polyimide layer 160 is cured 170, e.g., by a thermal process, resulting in the structure of FIG. 2.

Figure 5:
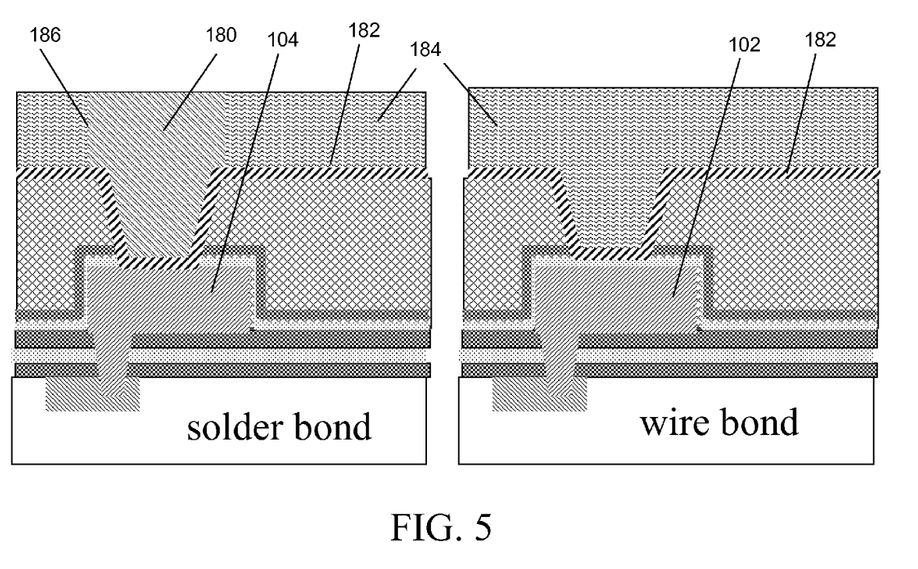
FIGS. 5-7 show one embodiment of a method of completing forming of a solder bond and a wire bond according to the invention.

FIG. 5 shows forming a solder bond 180 to solder bond metal region 104 while wire bond metal region 102 is covered. This process may include depositing a ball limiting metallurgy (BLM) layer 182, e.g., by PVD. BLM layer 182 includes any solder wettable terminal metallurgy (e.g., tin (Sn) alloy), which defines the size and area of solder bond 180 when completed. BLM layer 182 limits the flow of the solder ball to the desired area, and provides adhesion and contact to the chip wiring. FIG. 5 also shows depositing a photoresist 184 and forming an opening 186 in photoresist 184 over only solder bond metal region 104 (i.e., no opening over wire bond metal region 102) to BLM layer 182. In one embodiment, photoresist 184 may include a photosensitive dry polymer resist such as RISTON® available from DuPont. However, other photoresist material may also be employed. Solder for solder bond 180 is formed (deposited) in photoresist opening 186. Solder bond 180 may include any now known or later developed solder materials, e.g., including typically any alloy of lead-tin (PbSn) or tin (Sn)(Pb-free). As noted above, wire bond metal region 102 remains covered during this process by photoresist 184.

FIG. 6 shows exposing wire bond metal region 102 including removing silicon oxide layer 108 to wire bond metal region 102. This process includes removing photoresist 184 (FIG. 5) and BLM layer 182 (FIG. 5) except BLM layer 182S under solder bond 180 to expose silicon oxide layer 108 (FIG. 8) over wire bond metal region 102, e.g., by etching 192. This process may include performing an etch 194 (FIG. 6), e.g., RIE, to remove silicon oxide layer 108 over wire bond metal region 102 using material 130 as a mask.

FIGS. 6-7 show forming wire bond 190 (FIG. 7) to wire bond metal region 102. This process may optionally include performing a wet clean 196 (FIG. 7) using, for example, hydrofluoric acid of wire bond metal region 102 subsequent to silicon oxide layer 108 removal. In addition, this process may include cleaning and reflowing solder bond 180. Wire bond 190 may then be formed to wire bond metal region 102 using any now known or later developed techniques.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of forming a wire bond and a solder bond, the method comprising:
   providing a structure including a wire bond metal region for the wire bond and a solder bond metal region for the solder bond, both regions covered by a silicon nitride layer over a silicon oxide layer;
   forming in a material a first opening to the silicon oxide layer over the wire bond metal region and a second opening exposing the solder bond metal region;
   forming the solder bond to the solder bond metal region while the wire bond metal region is covered;
   exposing the wire bond metal region including removing the silicon oxide layer to the wire bond metal region; and
   forming the wire bond to the wire bond metal region.

2. The method of claim 1, wherein the first and second opening forming includes:
   forming a first photoresist over the silicon nitride layer over the solder bond metal region and the wire bond metal region;
   forming an intermediate opening through the first photoresist over only the solder bond metal region;
   removing the silicon nitride layer over only the solder bond metal region using the intermediate opening;
   removing the first photoresist;
   depositing an uncured photosensitive polyimide (PSPI) layer as the material;
   forming the first opening through the uncured PSPI layer over the wire bond metal region and the second opening through the uncured PSPI layer over the solder bond metal region;
   curing the PSPI layer; and
   etching to expose the solder bond metal region and remove the silicon nitride layer to the silicon oxide layer over the wire bond metal region.

3. The method of claim 2, wherein the solder bond forming includes:
   depositing a ball limiting metallurgy (BLM) layer;
   depositing a second photoresist;
   forming an opening in the second photoresist to the BLM layer over only the solder bond metal region;
   forming the solder bond in the second photoresist opening; and
   removing the second photoresist and the BLM layer except the BLM layer under the solder to expose the silicon oxide layer over the wire bond metal region.

4. The method of claim 3, wherein the second photoresist includes a photosensitive dry polymer resist.

5. The method of claim 3, further comprising:
   performing a wet clean of the wire bond metal region subsequent to the silicon oxide layer removing; and
   cleaning and reflowing the solder bond.

6. The method of claim 1, wherein the first and second opening forming includes:
   forming an uncured polyimide layer as the material over the silicon nitride layer over the solder bond metal region and the wire bond metal region;
   forming the first opening through the uncured polyimide layer to the silicon oxide layer over only the wire bond metal region using a first photoresist that covers the solder bond metal region;
   removing the first photoresist;
   forming the second opening through the uncured polyimide layer to only the solder bond metal region using a second photoresist that covers the wire bond metal region;
   removing the second photoresist; and
   curing the polyimide layer.

7. The method of claim 6, wherein the solder bond forming includes:
   depositing a ball limiting metallurgy (BLM) layer;
   depositing a third photoresist;
   forming an opening in the third photoresist over only the solder bond metal region to the BLM layer;
   forming the solder bond in the third photoresist opening; and
   removing the third photoresist and the BLM layer except the BLM layer under the solder to expose the silicon oxide layer over the wire bond metal region.

8. The method of claim 7, wherein the third photoresist includes a photosensitive dry polymer resist.

9. The method of claim 7, further comprising:
   performing a wet clean of the wire bond metal region subsequent to the silicon oxide layer removing; and
   cleaning and reflowing the solder bond.

10. The method of claim 6, wherein the uncured polyimide layer is non-photosensitive.

11. The method of claim 1, wherein each of the solder bond and wire bond metal regions includes one of: aluminum and copper.

12. A method of forming a wire bond and a solder bond, the method comprising:
   providing a structure including a wire bond metal region for the wire bond and a solder bond metal region for the solder bond, both regions covered by a silicon nitride layer over a silicon oxide layer;
   forming in a material a first opening to the silicon oxide layer over the wire bond metal region and a second opening exposing the solder bond metal region by:

forming a first photoresist over the silicon nitride layer over the solder bond metal region and the wire bond metal region, forming an intermediate opening over only the solder bond metal region through the first photoresist, removing the silicon nitride layer over only the solder bond metal region using the intermediate opening, removing the first photoresist, depositing an uncured photosensitive polyimide (PSPI) layer as the material, forming the first opening through the PSPI layer over the wire bond metal region and the second opening through the PSPI layer over the solder bond metal region, and curing the PSPI layer;

etching to expose the solder bond metal region and remove the silicon nitride layer to the silicon oxide layer over the wire bond metal region;

forming the solder bond to the solder bond metal region while the wire bond metal region is covered;

exposing the wire bond metal region including removing the silicon oxide layer to the wire bond metal region; and forming the wire bond to the wire bond metal region.

13. The method of claim 12, wherein the solder bond forming includes:

depositing a ball limiting metallurgy (BLM) layer;

depositing a second photoresist;

forming an opening in the second photoresist over only the solder bond metal region to the BLM layer;

forming the solder bond in the second photoresist opening; and removing the second photoresist and the BLM layer except the BLM layer under the solder bond to expose the silicon oxide layer over the wire bond metal region.

14. The method of claim 13, wherein the second photoresist includes a photosensitive dry polymer resist.

15. The method of claim 13, further comprising:

performing a wet clean of the wire bond metal region subsequent to the silicon oxide layer removing; and cleaning and reflowing the solder bond.

16. A method of forming a wire bond and a solder bond, the method comprising:

providing a structure including a wire bond metal region for the wire bond and a solder bond metal region for the solder bond, both regions covered by a silicon nitride layer over a silicon oxide layer;

forming in a material a first opening to the silicon oxide layer over the wire bond metal region and a second opening exposing the solder bond metal region by:

forming an uncured polyimide layer as the material over the silicon nitride layer over the solder bond metal region and the wire bond metal region, forming the first opening through the uncured polyimide layer to the silicon oxide layer over only the wire bond metal region using a first photoresist that covers the solder bond metal region, removing the first photoresist, forming the second opening through the uncured polyimide layer to only the solder bond metal region using a second photoresist that covers the wire bond metal region, removing the second photoresist, and curing the polyimide layer;

forming the solder bond to the solder bond metal region while the wire bond metal region is covered;

exposing the wire bond metal region including removing the silicon oxide layer to the wire bond metal region; and forming the wire bond to the wire bond metal region.

17. The method of claim 16, wherein the solder bond forming includes:

depositing a ball limiting metallurgy (BLM) layer;

depositing a third photoresist;

forming an opening in the third photoresist over only the solder bond metal region to the BLM layer;

forming the solder bond in the third photoresist opening; and removing the third photoresist and the BLM layer except the BLM layer under the solder bond to expose the silicon oxide layer over the wire bond metal region.

18. The method of claim 17, wherein the third photoresist includes a photosensitive dry polymer resist.

19. The method of claim 17, further comprising:

performing a wet clean of the wire bond metal region subsequent to the silicon oxide layer removing; and cleaning and reflowing the solder bond.

20. The method of claim 16, wherein the uncured polyimide layer is non-photosensitive.

* * * * *